(12) United States Patent
Fujimori et al.

(10) Patent No.: US 10,964,632 B2
(45) Date of Patent: Mar. 30, 2021

(54) SEMICONDUCTOR DEVICE

(71) Applicant: Toshiba Memory Corporation, Minato-ku (JP)

(72) Inventors: Takeshi Fujimori, Chigasaki (JP); Soichiro Ibaraki, Kawasaki (JP); Shinji Yamashita, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/564,083

(22) Filed: Sep. 9, 2019

(65) Prior Publication Data

US 2020/0303290 A1    Sep. 24, 2020

(30) Foreign Application Priority Data

Mar. 20, 2019    (JP) .............................. JP2019-052914

(51) Int. Cl.
*H01L 23/498* (2006.01)
*H01L 27/11517* (2017.01)
*H01L 23/556* (2006.01)

(52) U.S. Cl.
CPC ...... *H01L 23/49811* (2013.01); *H01L 23/556* (2013.01); *H01L 27/11517* (2013.01)

(58) Field of Classification Search
CPC ............ H01L 23/49811; H01L 23/556; H01L 1127/11517
USPC ....................................................... 257/737
See application file for complete search history.

(56) References Cited

U.S. PATENT DOCUMENTS

| 5,990,564 | A | 11/1999 | Degani et al. |
| 6,661,093 | B2 | 12/2003 | Ujiie et al. |
| 2002/0074656 | A1* | 6/2002 | Ujiie ...................... H01L 23/556 |
| | | | 257/738 |
| 2009/0294928 | A1* | 12/2009 | Kim .................... H01L 23/3135 |
| | | | 257/659 |
| 2014/0183755 | A1* | 7/2014 | Huang .................... H01L 24/80 |
| | | | 257/774 |
| 2018/0301418 | A1* | 10/2018 | Chang Chien ...... H01L 21/4857 |
| 2020/0091087 | A1 | 3/2020 | Yamashita et al. |

FOREIGN PATENT DOCUMENTS

| JP | 63-229726 A | | 9/1988 |
| JP | 63229726 A | * | 9/1988 |
| JP | 11-016940 A | | 1/1999 |
| JP | 2002-170826 A | | 6/2002 |

* cited by examiner

*Primary Examiner* — Tong-Ho Kim
(74) *Attorney, Agent, or Firm* — Oblon, McClelland, Maier & Neustadt, L.L.P.

(57) ABSTRACT

According to one embodiment, there is provided a semiconductor device including a substrate, a semiconductor chip, and a conductive film. The substrate has a main face. The semiconductor chip has a surface equipped with an SRAM circuit. The semiconductor chip is mounted on the main face via a plurality of bump electrodes in a state where the surface faces the main face. The conductive film is disposed on the main face or the surface. The conductive film extends planarly between the plurality of bump electrodes. A region in the main face or the surface where the conductive film is disposed overlaps the SRAM circuit in a direction perpendicular to the main face.

20 Claims, 9 Drawing Sheets

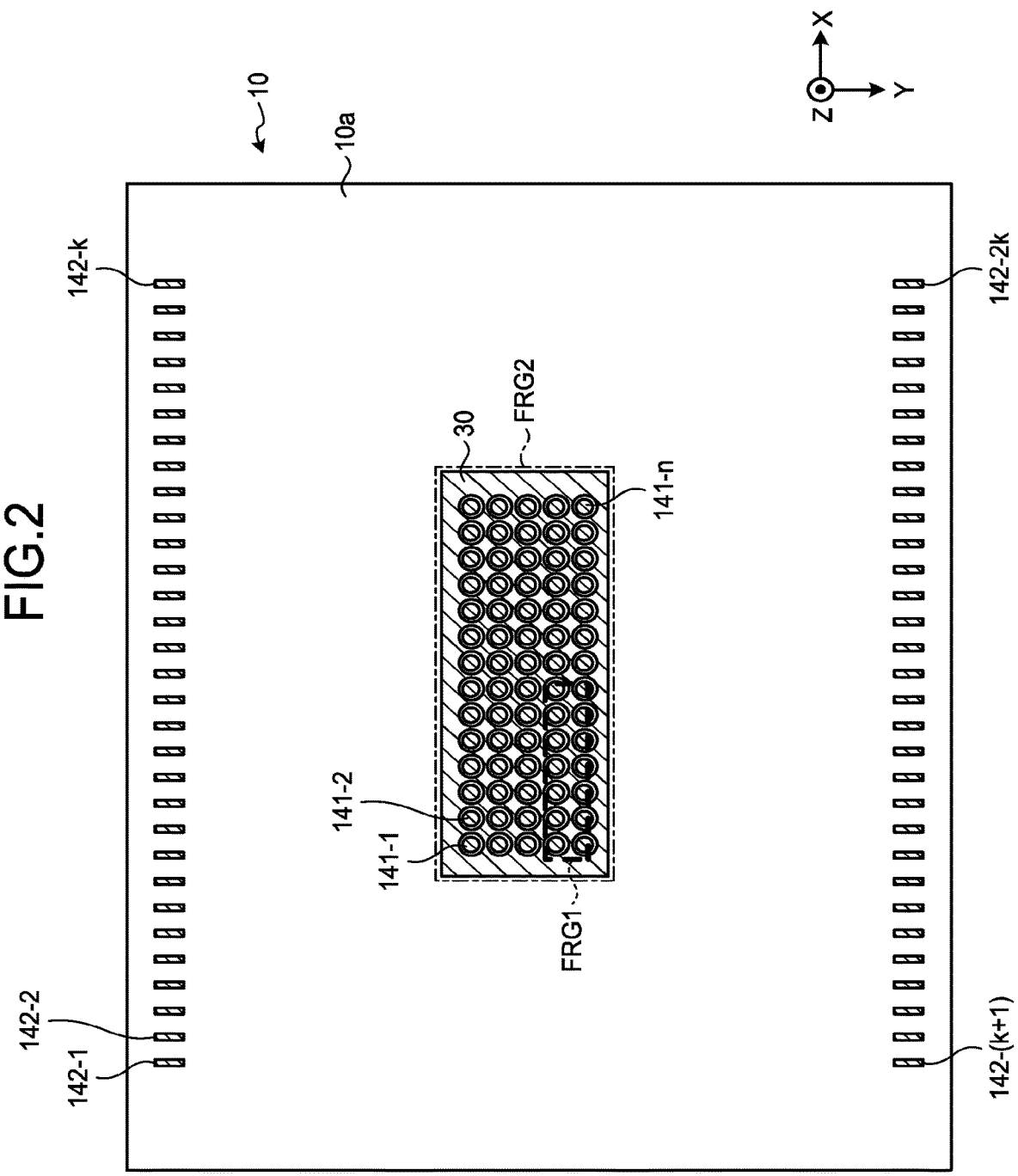

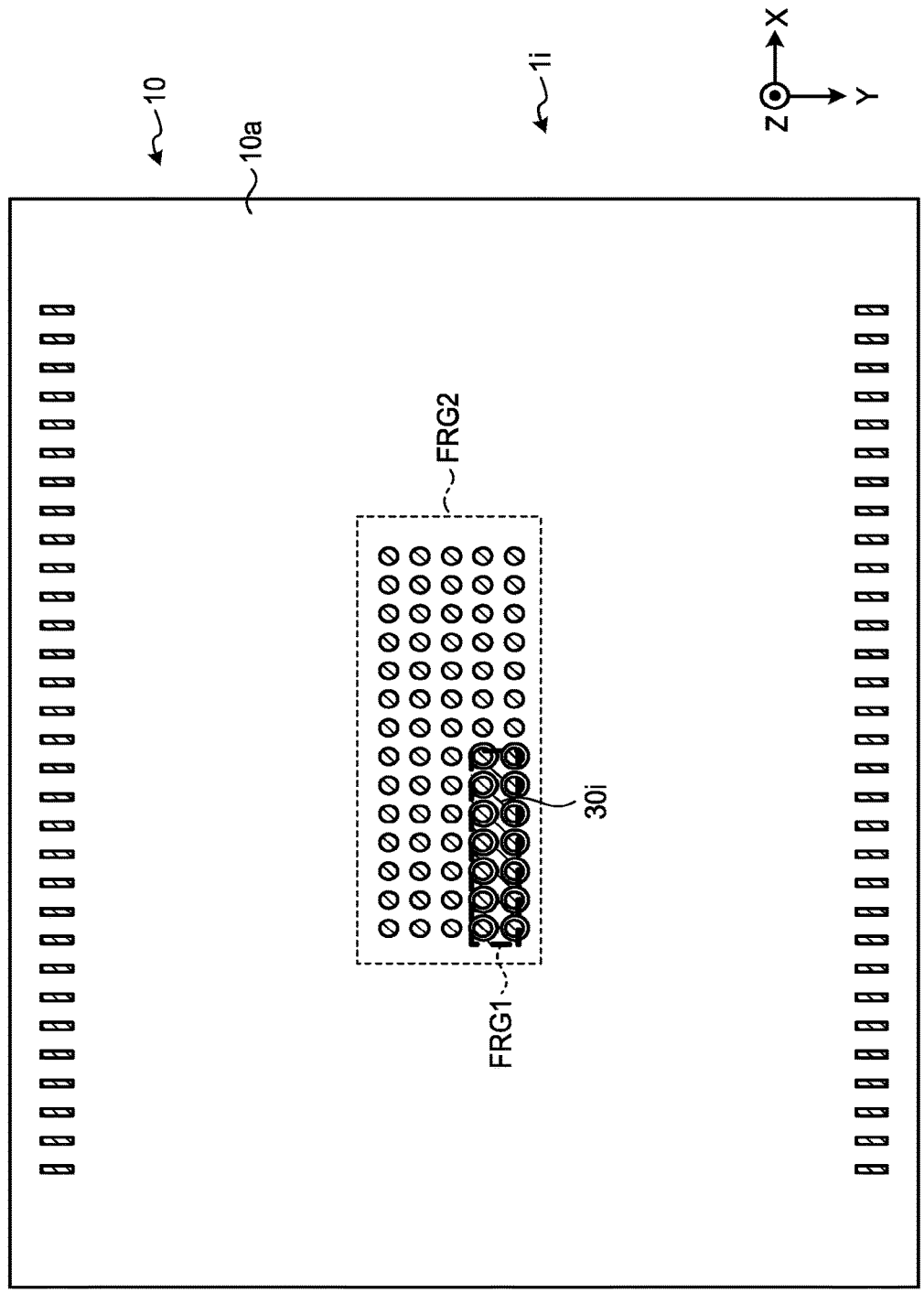

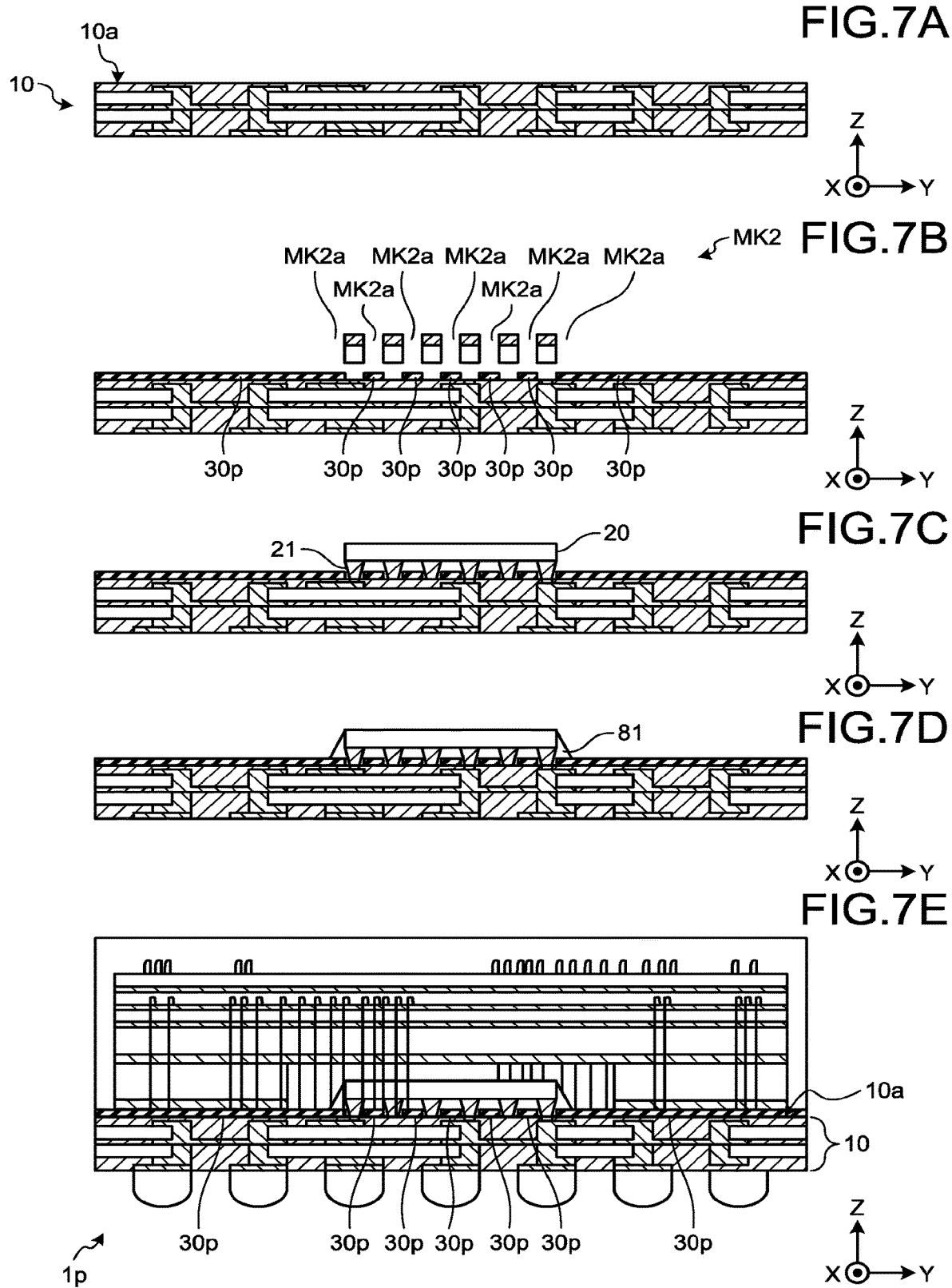

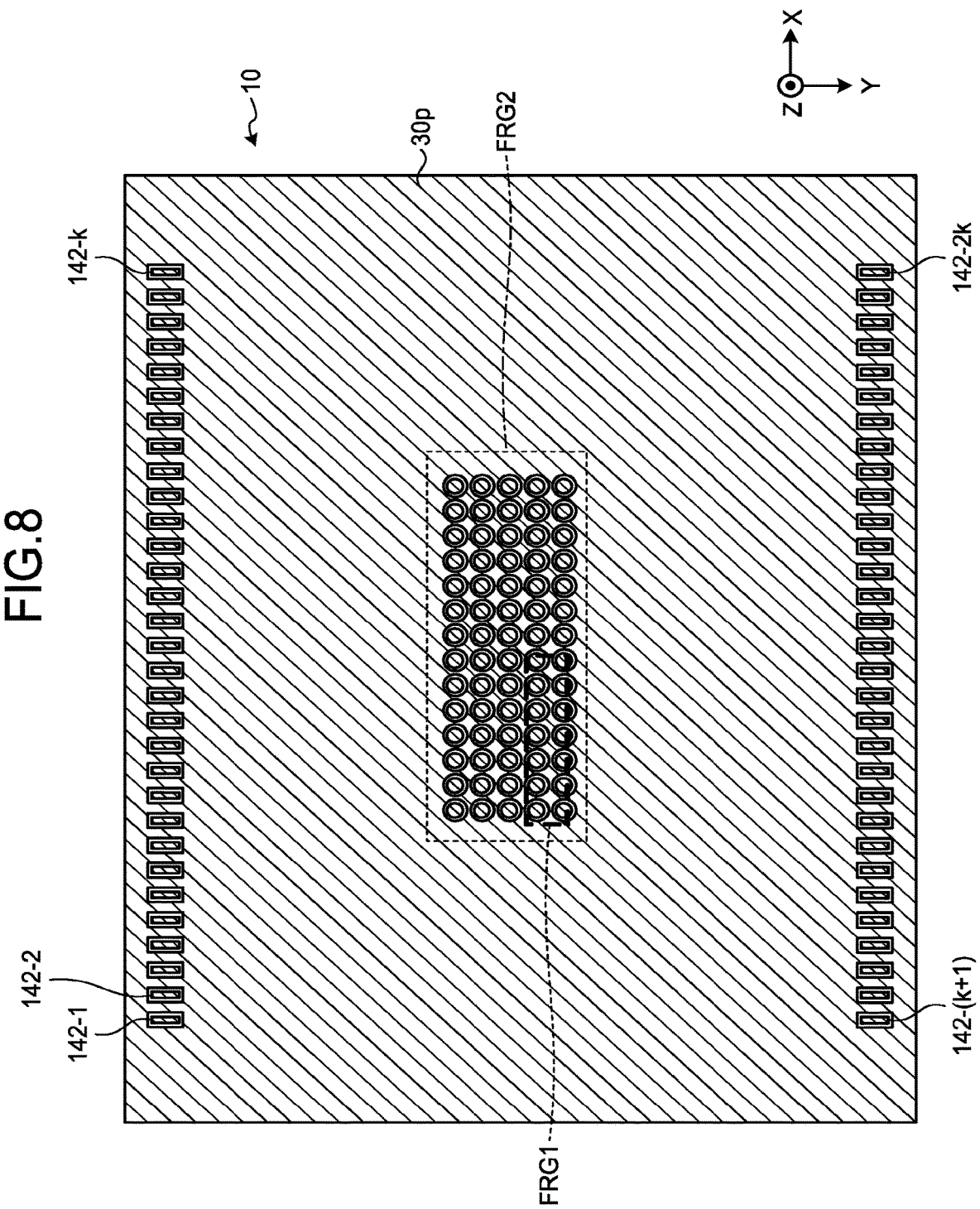

SEMICONDUCTOR DEVICE

CROSS-REFERENCE TO RELATED APPLICATIONS

This application is based upon and claims the benefit of priority from Japanese Patent Application No. 2019-052914, filed on Mar. 20, 2019; the entire contents of which are incorporated herein by reference.

FIELD

Embodiments described herein relate generally to a semiconductor device.

BACKGROUND

A semiconductor device may be constructed by mounting a semiconductor chip on a main face of a substrate via a plurality of bump electrodes. Here, it is desirable to improve the reliability of the mounted semiconductor chip.

BRIEF DESCRIPTION OF THE DRAWINGS

FIG. 2 is a plan view illustrating the structure of a substrate and a conductive film in an embodiment;

FIG. 4 is a plan view illustrating the structure of a substrate and a conductive film in a first variation of an embodiment;

FIGS. 7A to 7E are sectional views illustrating the structure and a manufacturing method of a semiconductor device according to a fourth variation of an embodiment;

FIG. 8 is a plan view illustrating the structure of a substrate and a conductive film in a fourth variation of an embodiment.

DETAILED DESCRIPTION

Figure 1:
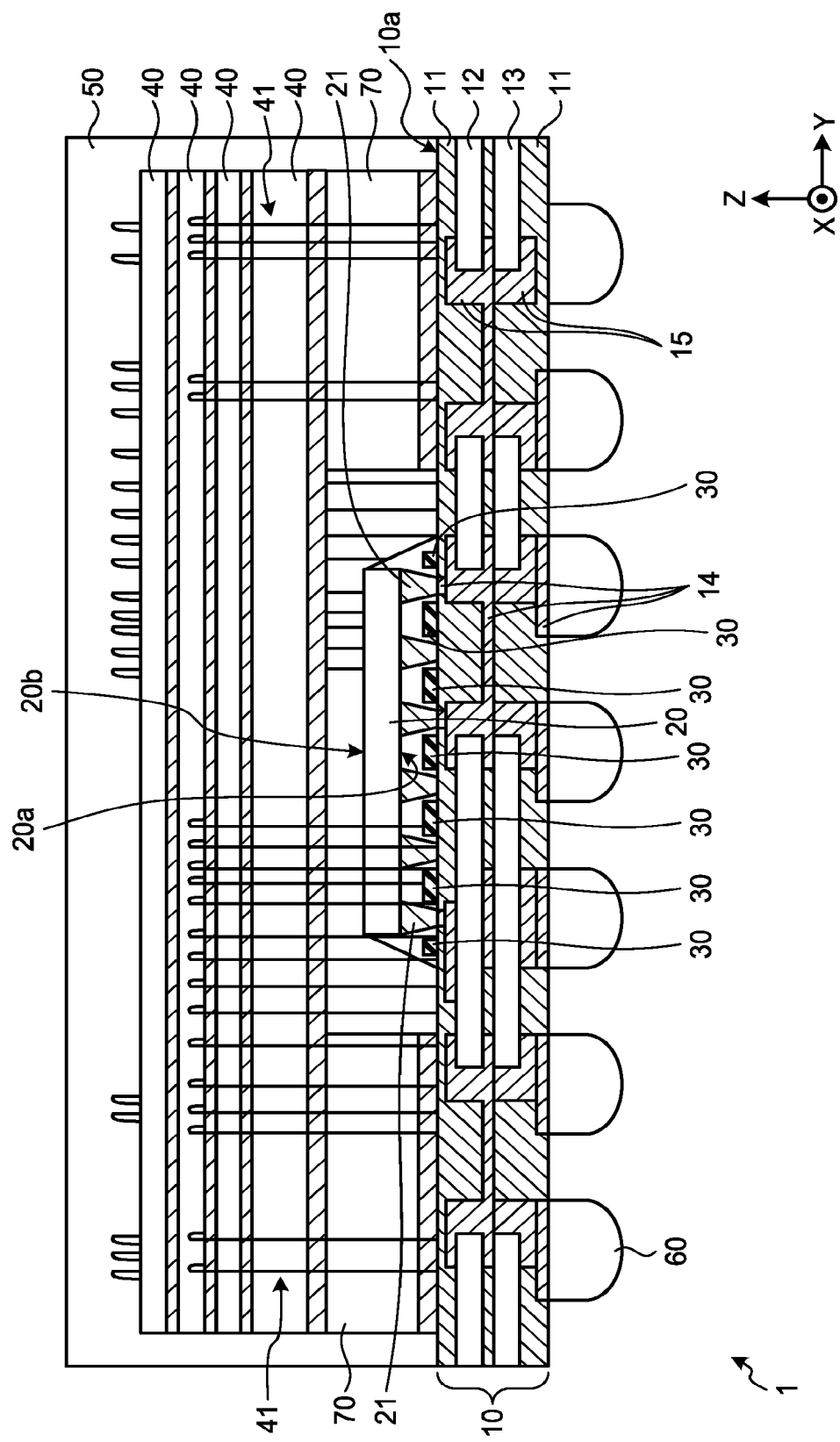
FIG. 1 is a sectional view illustrating the structure of a semiconductor device according to an embodiment.

In general, according to one embodiment, there is provided a semiconductor device including a substrate, a semiconductor chip, and a conductive film. The substrate has a main face. The semiconductor chip has a surface equipped with an SRAM circuit. The semiconductor chip is mounted on the main face via a plurality of bump electrodes in a state where the surface faces the main face. The conductive film is disposed on the main face or the surface. The conductive film extends planarly between the plurality of bump electrodes. A region in the main face or the surface where the conductive film is disposed overlaps the SRAM circuit in a direction perpendicular to the main face.

Exemplary embodiments of a semiconductor device will be explained below in detail with reference to the accompanying drawings. The present invention is not limited to the following embodiments.

Embodiment

In a semiconductor device according to an embodiment, a semiconductor chip may be mounted by a flip chip method on a surface (main face) of the substrate having the largest area via a plurality of bump electrodes and constructed as a package. In a case where the semiconductor device is a Solid State Drive (SSD), for example, a plurality of memory chips may be mounted on the substrate by a wire bonding method, while a controller chip may be mounted on the substrate by a flip chip method.

A semiconductor chip (controller chip) is equipped with an SRAM circuit, and there is a tendency for capacity enlargement and voltage reduction of the SRAM circuit due to the demand for scale enlargement of the system. Moreover, in a case where the semiconductor chip (controller chip) is mounted on the substrate by a flip chip method, the distance between the surface (SRAM circuit) of the semiconductor chip (controller chip) and the substrate becomes short. Thus, radioactive rays (e.g., α rays) emitted from a trace amount of a radioactive substance contained in the material of the substrate (e.g., organic substrate), which is one of the package components, may enter the SRAM circuit equipped in the semiconductor chip (controller chip). As a result, a soft error that the SRAM circuit equipped in the semiconductor chip malfunctions due to the influence of radioactive rays (e.g., α rays) tends to occur.

On the other hand, although it is conceivable to form a plurality of substrate wirings (a plurality of land wirings) electrically connected with a plurality of bump electrodes in the substrate respectively with low α-ray materials, the plurality of substrate wirings are electrically separated from each other, and therefore it is substantially difficult to shield the SRAM circuit of the semiconductor chip from radioactive rays (e.g., α rays).

Therefore, in this embodiment, a conductive film is provided on the main face of the substrate in the semiconductor device. The conductive film overlaps the SRAM circuit in a direction perpendicular to the main face. The conductive film extends planarly between the plurality of bump electrodes. This aims at efficient shielding of radioactive rays.

Specifically, a semiconductor device 1 may be constructed as illustrated in FIG. 1. FIG. 1 is a sectional view illustrating the structure of the semiconductor device 1.

The semiconductor device 1 includes a substrate 10, a semiconductor chip 20, a conductive film 30, a plurality of semiconductor chips 40-1, a sealing resin 50, an external electrode 60, and a spacer 70. In the following description, a direction perpendicular to one of the surfaces having the largest area (front surface 10a, first main face) of the substrate 10 will be referred to as a Z direction, and two directions that are orthogonal to each other in a plane perpendicular to the Z direction will be referred to as an X direction and a Y direction.

The substrate 10 has a surface (front surface 10a, first main face) having the largest area on the +Z side, and another surface (rear surface 10b, second main face) having the largest area on the −Z side. The semiconductor chip 20, the conductive film 30, and the plurality of semiconductor chips 40-1 to 40-n are mounted on the front surface 10a of the substrate 10, while the external electrode 60 is mounted on the rear surface 10b of the substrate 10. The semiconductor chip 20, the conductive film 30, and the plurality of semiconductor chips 40 mounted on the front surface 10a side of the substrate 10 are sealed with the sealing resin 50. The external electrode 60 mounted on the rear surface 10b side of the substrate 10 may be formed of a material containing a conductive substance as a main component, and the surface of the external electrode 60 is exposed so that the external electrode 60 can be electrically connected from the outside.

The substrate 10 may be an organic substrate containing an organic substance such as a printed wiring board, for example. The substrate 10 includes a solder resist layer 11, a prepreg layer 12, a core layer 13, a conductive layer 14, and a through-hole electrode 15. The solder resist layer 11 may be formed of a material containing an insulator (e.g., insulating organic substance) as a main component. The material of the solder resist layer 11 may contain a trace amount of a radioactive substance. The prepreg layer 12 may be formed of a material containing an insulator (e.g., organic substance such as plastic) as a main component. The material of the prepreg layer 12 may contain a trace amount of radioactive substance. The core layer 13 may be formed of a material containing an insulator (e.g., organic substance such as plastic) as a main component. The material of the core layer 13 may contain a trace amount of radioactive substance. The conductive layer 14 may be formed of a material containing a conductive substance (e.g., copper) as a main component. The through-hole electrode 15 may be formed of a material containing a conductive substance (e.g., copper) as a main component.

The semiconductor chip 20 is a controller chip, for example. The semiconductor chip 20 has a surface (front surface 20a, third main face) having the largest area on the −Z side, and another surface (rear surface 20b, fourth main face) having the largest area on the +Z side. When the semiconductor device 1 is an SSD, the semiconductor chip 20 is a controller chip, for example, and may be mounted on the substrate 10 by a flip chip method. The front surface 20a of the semiconductor chip 20 faces the front surface 10a of the substrate 10. The semiconductor chip 20 is mounted on the front surface 10a of the substrate 10 via a plurality of bump electrodes 21 by a face-down method (flip chip method). That is, the semiconductor chip 20 is mounted on the front surface 10a of the substrate 10 via the plurality of bump electrodes 21 in a state where the front surface 20a faces the front surface 10a of the substrate 10.

A plurality of pad electrodes are disposed on the front surface 20a of the semiconductor chip 20, and the plurality of pad electrodes are electrically connected with a conductive layer 14 in the substrate 10 via the plurality of bump electrodes 21. Thus, a predetermined signal can be transmitted and received between the external electrode 60 and the semiconductor chip 20 via the conductive layer 14 and the through-hole electrode 15.

A conductive layer 14 that can be electrically connected with the plurality of bump electrodes 21 in the substrate 10 has a plurality of electrode patterns 141-1 to 141-n (n is an arbitrary integer of 2 or more) arranged two-dimensionally in the X and Y directions as illustrated in FIG. 2 on the front surface (i.e., main face on the +Z side) 10a of the substrate 10. FIG. 2 is a plan view illustrating the structure of the substrate 10. The electrode patterns 141-1 to 141-n may be electrically separated from each other on the front surface 10a so that different signals can be transferred.

The front surface 20a of the semiconductor chip 20 is equipped with a CPU and an SRAM circuit. The SRAM circuit temporarily stores data as a work area of the CPU.

The front surface 10a of the substrate 10 has a region FRG1 and a region FRG2. The region FRG1 overlaps the SRAM circuit in a direction (i.e., Z direction) perpendicular to the front surface 10a of the substrate 10 when the semiconductor chip 20 is mounted on the substrate 10 by a flip chip method. The region FRG1 has an area substantially equal to that of the SRAM circuit. The region FRG2 overlaps the semiconductor chip 20 in the Z direction when the semiconductor chip 20 is mounted on the substrate 10 by a flip chip method. The region FRG2 has an area substantially equal to that of the semiconductor chip 20. The region FRG1 is included in the region FRG2. That is, the region FRG2 is a region overlapping the SRAM circuit in the Z direction.

The conductive film 30 is disposed on the front surface 10a of the substrate 10. For example, the conductive film 30 covers the region FRG2 in the front surface 10a (see FIG. 1). The conductive film 30 overlaps the SRAM circuit in the Z direction. The entire region of the conductive film 30 overlaps the SRAM circuit in the Z direction. The conductive film 30 extends planarly (that is, in X and Y directions) between the plurality of electrode patterns 141-1 to 141-n in the region FRG2. That is, the conductive film 30 extends planarly (that is, in X and Y directions) between the plurality of bump electrodes 21 in the region FRG2. The conductive film 30 may be formed of a material containing a conductive substance (e.g., copper) as a main component. The film thickness of the conductive film 30 may be 23 μm or more. Thus, in a case where the energy of radioactive rays (e.g., α rays) coming from a radioactive substance contained in the substrate 10 is 9 MeV or less, the conductive film 30 can achieve effective shielding from the radioactive rays.

Moreover, the conductive film 30 separates and encloses the electrode patterns 141-1 to 141-n in the region FRG2. That is, the conductive film 30 separates and encloses the bump electrodes 21 in the region FRG2 (see FIG. 1). Here, the conductive film 30 is electrically insulated from the electrode patterns 141-1 to 141-n. The conductive film 30 is electrically insulated from the bump electrodes 21. Thus, the conductive film 30 can be in a potentially floating state. As a result, transmission and reception of signals by the bump electrodes 21 can be reliably performed.

Although not illustrated, the conductive film 30 may be selectively connected with an electrode pattern 141 having the ground potential among the plurality of electrode patterns 141-1 to 141-n. That is, the conductive film 30 may be selectively connected with a bump electrode 21 having the ground potential among the plurality of bump electrodes 21. Thus, the conductive film 30 can be brought to the ground potential. Therefore, the conductive film 30 can achieve further shielding from EMI noise (e.g., external electromagnetic wave noise) due to external electromagnetic wave.

The plurality of semiconductor chips 40 are each a memory chip, for example, and are mounted on the semiconductor chip (controller chip) 20 in a spacer structure. That is, the spacer 70 thicker than the mounting height of the semiconductor chip 20 from the front surface 10a of the substrate 10 is disposed at a position separated in the X and Y directions with respect to the semiconductor chip 20. The plurality of semiconductor chips 40 are stacked on the +Z side of the spacer 70. The plurality of semiconductor chips 40 may be mounted on the substrate 10 by a wire bonding method. Here, the conductive layer 14 that can be electrically connected with a plurality of bonding wires 41 in the substrate 10 has a plurality of electrode patterns 142-1 to 142-2k (k is an arbitrary integer of 2 or more) illustrated in FIG. 2 on the front surface (i.e., main face on the +Z side)

10a. Thus, the plurality of semiconductor chips 40 can be mounted on the substrate 10 in a spacer structure by a wire bonding method.

Next, a manufacturing method of the semiconductor device 1 will be described with reference to FIGS. 1 and 3A to 3D. FIGS. 3A to 3D are process sectional views illustrating a manufacturing method of the semiconductor device 1. FIG. 1, which is a sectional view illustrating the structure of the semiconductor device 1, will be used as a sectional view illustrating a manufacturing method of the semiconductor device 1.

Figure 3A:
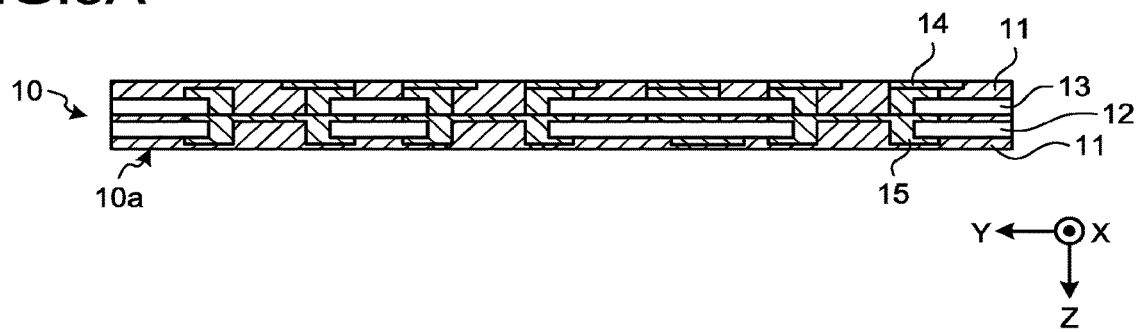
FIGS. 3A to 3D are sectional views illustrating a manufacturing method of a semiconductor device according to an embodiment.

In the step illustrated in FIG. 3A, the substrate 10 is prepared by a predetermined process. For example, predetermined machining is performed on a substrate having the solder resist layer 11, the prepreg layer 12, and the core layer 13, and processing such as conductive plating is performed to form the conductive layer 14 and the through-hole electrode 15.

Figure 3B:
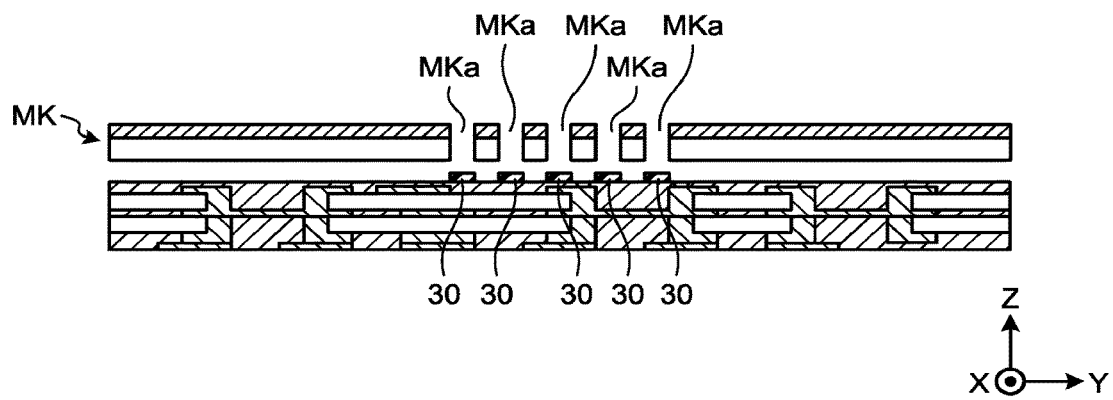

In the step illustrated in FIG. 3B, the conductive film 30 is deposited on the front surface 10a of the substrate 10 by sputtering or the like. For example, a mask MK having an opening MKa at a position corresponding to the periphery of the plurality of electrode patterns 141-1 to 141-n in the region FRG2 is prepared, and the substrate 10 is sputtered from the +Z side over the mask MK. Thus, the conductive film 30 is formed in a pattern extending planarly (that is, in X and Y directions) between the plurality of electrode patterns 141-1 to 141-n in the region FRG2 (see FIG. 2). That is, the conductive film 30 is formed in a pattern extending planarly (that is, in X and Y directions) between the plurality of bump electrodes 21 in the region FRG2.

Figure 3C:
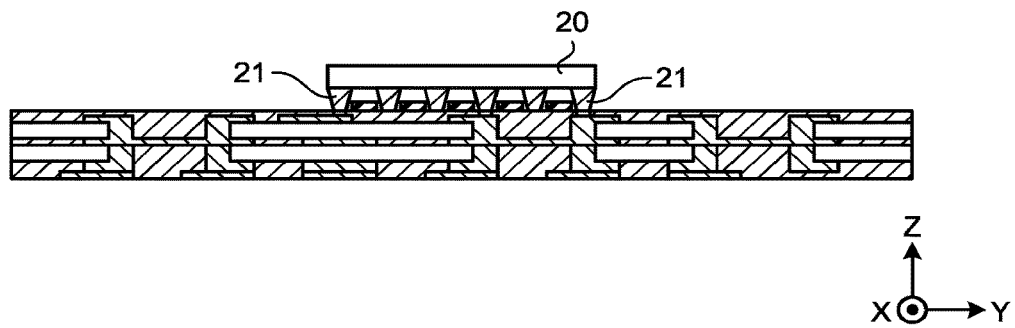

In the step illustrated in FIG. 3C, the semiconductor chip (controller chip) 20 is mounted (die-bonded) on the front surface 10a of the substrate 10 via the plurality of bump electrodes 21 by a predetermined process. For example, the bump electrodes 21 and the conductive layer 14 are joined in alloy junction with each other by heating to a predetermined temperature or the like.

Figure 3D:
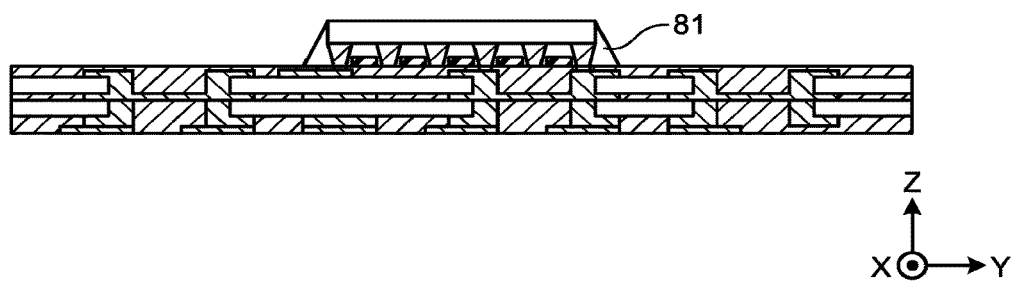

In the step illustrated in FIG. 3D, the semiconductor chip 20 is bonded to the substrate 10 by a predetermined process. For example, an underfill (e.g., adhesive) 81 is applied between the semiconductor chip 20 and the substrate 10.

In the step illustrated in FIG. 1, the spacer 70 is formed at a position separated in the X and Y directions with respect to the semiconductor chip 20, the plurality of semiconductor chips 40 are sequentially stacked on the +Z side of the spacer 70, and electrode pads in each semiconductor chip 40 and an electrode pattern 142 in the substrate 10 are connected with each other by the bonding wires 41. Thus, the plurality of semiconductor chips 40 are mounted on the substrate 10 in a spacer structure by a wire bonding method, and the semiconductor device 1 can be completed.

As described above, in this embodiment, the conductive film 30 is provided on the front surface 10a of the substrate 10 in the semiconductor device 1. For example, the conductive film 30 covers the region FRG2 in the front surface 10a. The conductive film 30 overlaps the SRAM circuit in the Z direction. The conductive film 30 extends planarly between the plurality of bump electrodes 21. Thus, the SRAM circuit equipped in the semiconductor chip 20 can be efficiently shielded from radioactive rays (e.g., α rays) that may be generated from the substrate 10.

As illustrated in FIG. 4, a conductive film 30i may cover the region FRG1 in the front surface 10a in a semiconductor device 1i. Here, the conductive film 30i overlaps the SRAM circuit in the Z direction. The conductive film 30i has an area substantially equal to that of the SRAM circuit. The conductive film 30i extends planarly (that is, in X and Y directions) between the plurality of electrode patterns 141 in the region FRG1. That is, the conductive film 30i extends planarly (that is, in X and Y directions) between the plurality of bump electrodes 21 in the region FRG1. It is also possible with this structure to efficiently shield the SRAM circuit equipped in the semiconductor chip 20 from radioactive rays (e.g., α rays) that may be generated from the substrate 10.

Alternatively, in a semiconductor device 1j, a conductive film 30j may be disposed not on the front surface 10a of the substrate 10 but on the front surface 20a of the semiconductor chip 20. The conductive film 30j overlaps the SRAM circuit in the Z direction.

Here, the conductive film 30j may be disposed over the entire region overlapping the region FRG1 in the Z direction. Moreover, the conductive film 30j may be disposed in an area substantially equal to that of the SRAM circuit.

Alternatively, the conductive film 30j may be disposed over the entire region overlapping the region FRG2 in the Z direction. The entire region of the conductive film 30j overlaps the SRAM circuit in the Z direction. For example, as illustrated in FIG. 5E, the conductive film 30j extends planarly (that is, in X and Y directions) between the plurality of bump electrodes 21 in the semiconductor device 1j. The conductive film 30j may cover the front surface 20a of the semiconductor chip 20. FIGS. 5A to 5E are sectional views illustrating the structure and a manufacturing method of the semiconductor device 1j according to a second variation of the embodiment. In this case, the semiconductor device 1j may be manufactured as illustrated in FIGS. 5A to 5E. FIGS. 5A to 5D are process sectional views illustrating a manufacturing method of a semiconductor device, and FIG. 5E is a sectional view illustrating the structure and a manufacturing method of the semiconductor device 1j.

Figure 5A:
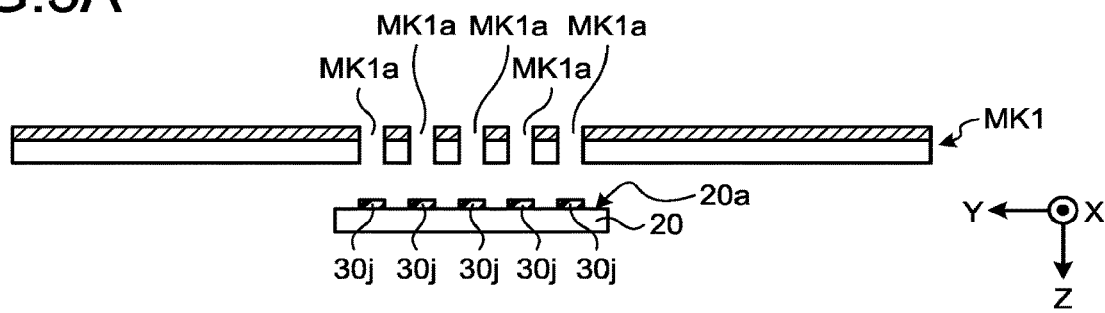
FIGS. 5A to 5E are sectional views illustrating the structure and a manufacturing method of a semiconductor device according to a second variation of an embodiment.

In the step illustrated in FIG. 5A, after the step illustrated in FIG. 3C is performed, the conductive film 30j is deposited on the front surface 20a of the semiconductor chip 20 by sputtering or the like. For example, a mask MK1 having an opening MK1a at a position corresponding to the periphery of the plurality of bump electrodes 21 in the front surface 20a is prepared, and the semiconductor chip 20 is sputtered from the −Z side over the mask MK1. Thus, the conductive film 30j is disposed on the front surface 20a of the semiconductor chip 20. The conductive film 30j is formed in a pattern extending planarly (that is, in X and Y directions) between the plurality of bump electrodes 21 (see FIG. 2).

Figure 5B:
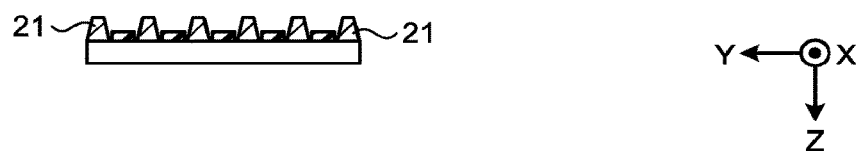

In the step illustrated in FIG. 5B, the plurality of bump electrodes 21 are joined to the plurality of electrode pads on the front surface 20a of the semiconductor chip 20.

Figure 5C:
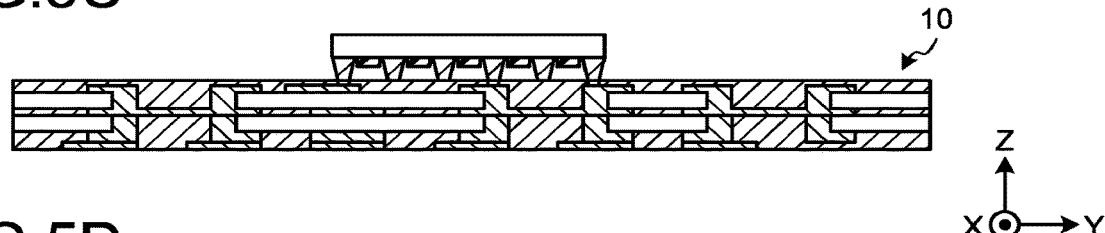
Figure 5D:
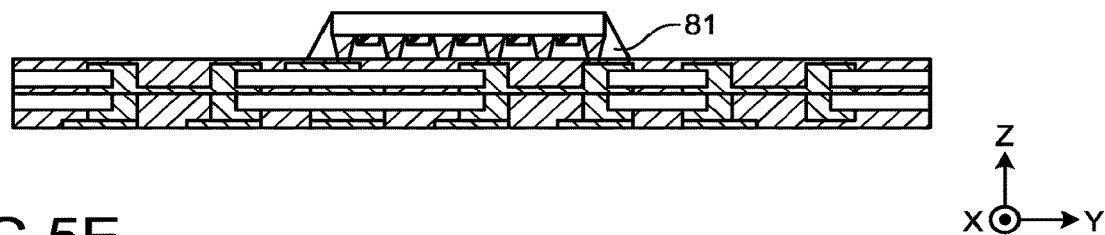
Figure 5E:
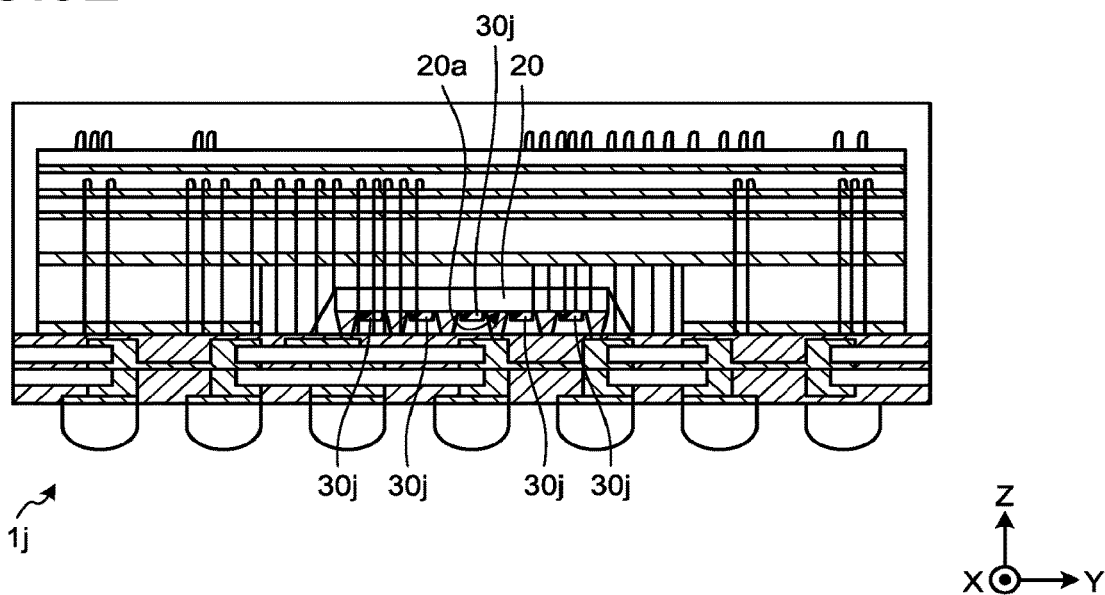

In the steps illustrated in FIGS. 5C, 5D, and 5E, processing similar to the steps illustrated in FIGS. 3C, 3D, and 1 is performed.

In such a manner, the conductive film 30j is disposed on the front surface 20a of the semiconductor chip 20. For example, the conductive film 30j covers the front surface 20a. The conductive film 30j overlaps the SRAM circuit in the Z direction. It is also possible with this structure to efficiently shield the SRAM circuit equipped in the semiconductor chip 20 from radioactive rays (e.g., α rays) that may be generated from the substrate 10.

Figure 6A:
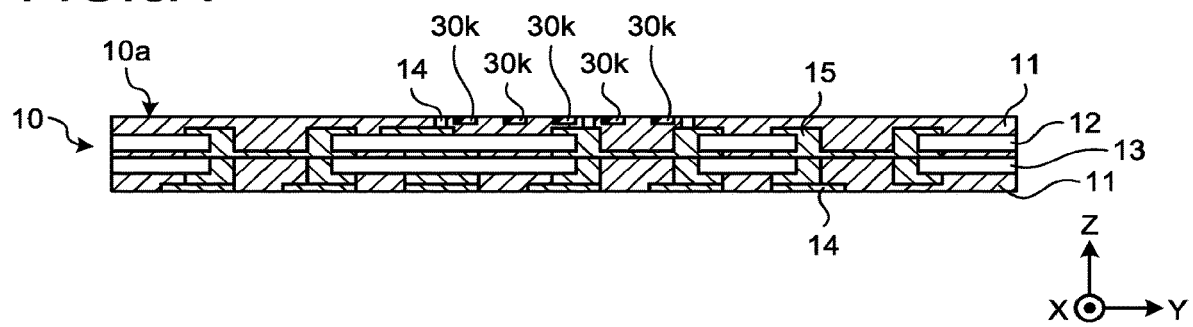
FIGS. 6A to 6D are sectional views illustrating the structure and a manufacturing method of a semiconductor device according to a third variation of an embodiment.
Figure 6B:
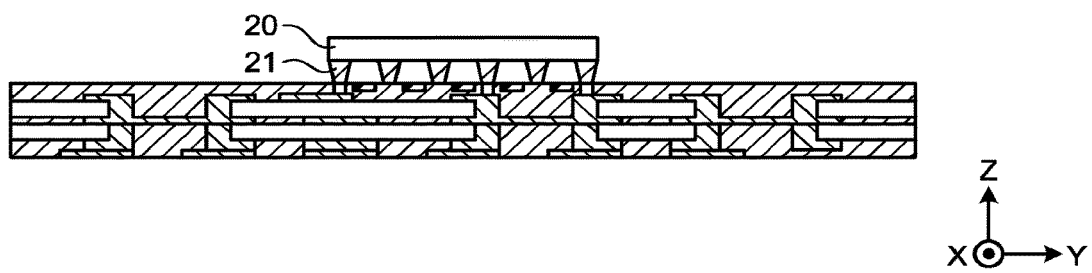
Figure 6C:
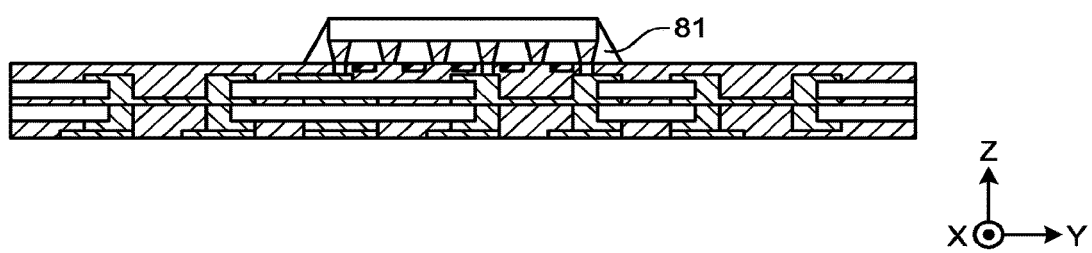
Figure 6D:
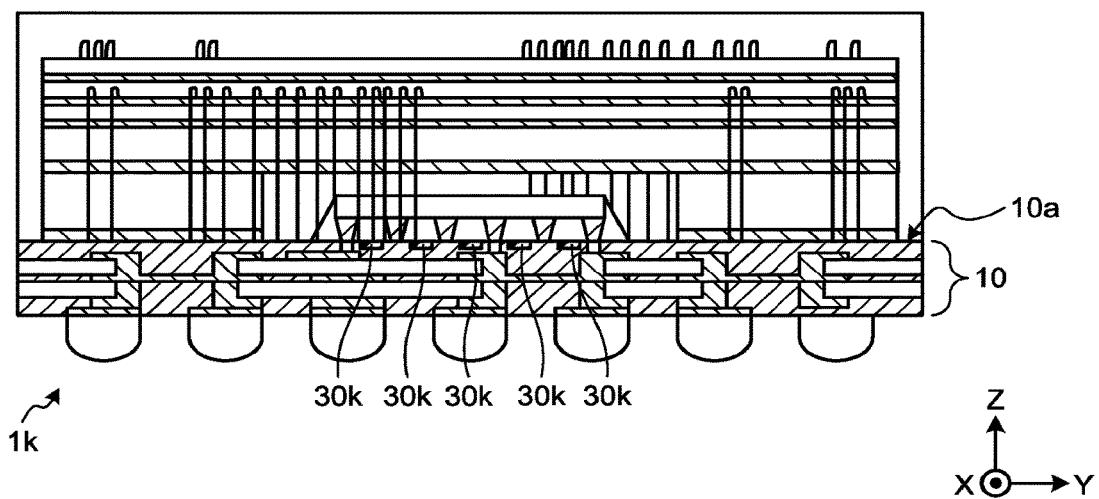

Alternatively, as illustrated in FIG. 6D, a conductive film 30k may be embedded in the region FRG2 of the front surface 10a in a semiconductor device 1k. FIGS. 6A to 6D are sectional views illustrating the structure and a manufacturing method of the semiconductor device 1k according to a third variation of the embodiment. The conductive film 30k extends planarly (in X and Y directions) between the plurality of electrode patterns 141-1 to 141-n in the region FRG2. That is, the conductive film 30k extends planarly (in X and Y directions) between the plurality of bump electrodes 21 in the region FRG2. In this case, the semiconductor device 1k may be manufactured as illustrated in FIGS. 6A to 6D. FIGS. 6A to 6D are process sectional views illustrating a manufacturing method of the semiconductor device 1k, and FIG. 6D is a sectional view illustrating the structure and a manufacturing method of the semiconductor device 1k.

In the step illustrated in FIG. 6A, the substrate 10 is prepared by a predetermined process. For example, predetermined machining is performed on a substrate having the solder resist layer 11, the prepreg layer 12, and the core layer 13, and processing such as conductive plating is performed to form the conductive layer 30k in addition to the conductive layer 14 and the through-hole electrode 15.

In the steps illustrated in FIGS. 6B, 6C, and 6D, processing similar to the steps illustrated in FIGS. 3C, 3D, and 1 are performed.

In such a manner, the conductive film 30k is disposed on the front surface 10a of the substrate 10. For example, the conductive film 30k is embedded in the region FRG2 of the front surface 10a. The conductive film 30k overlaps the SRAM circuit in the Z direction. The conductive film 30k overlaps the semiconductor chip 20 in the Z direction. It is also possible with this structure to efficiently shield the SRAM circuit equipped in the semiconductor chip 20 from radioactive rays (e.g., α rays) that may be generated from the substrate 10.

Alternatively, as illustrated in FIGS. 7E and 8, a conductive film 30p may entirely cover the front surface 10a of the substrate 10 in a semiconductor device 1p. FIGS. 7A to 7E are sectional views illustrating the structure and a manufacturing method of the semiconductor device 1p according to a fourth variation of the embodiment. FIG. 8 is a plan view illustrating the structure of the substrate 10 and the conductive film 30p in the fourth variation of the embodiment. The conductive film 30p extends planarly (in X and Y directions) between the plurality of electrode patterns 141-1 to 141-n and outside the plurality of electrode patterns 141-1 to 141-n to cover the front surface 10a. That is, the conductive film 30p extends planarly (in X and Y directions) between the plurality of bump electrodes 21 and outside the plurality of bump electrodes 21 on the entire front surface 10a.

As illustrated in FIG. 8, the conductive film 30p separates and encloses the electrode patterns 142-1 to 142-2k outside the region FRG2 in XY plan view. That is, the conductive film 30p separates and encloses the bonding wires 41 outside the region FRG2 (see FIG. 1). Here, the conductive film 30p is electrically insulated from the electrode patterns 142-1 to 142-2k. The conductive film 30p is electrically insulated from the bonding wires 41. Thus, the conductive film 30p can be in a potentially floating state. As a result, transmission and reception of signals by the bonding wires 41 can be reliably performed in the conductive film 30p.

Moreover, in this case, the semiconductor device 1p may be manufactured as illustrated in FIGS. 7A to 7E. FIGS. 7A to 7D are process sectional views illustrating a manufacturing method of the semiconductor device 1p, and FIG. 7E is a sectional view illustrating the structure and a manufacturing method of the semiconductor device 1p.

The step illustrated in FIG. 7A is performed in a manner similar to the step illustrated in FIG. 3A.

In the step illustrated in FIG. 7B, the conductive film 30p is deposited on the front surface 10a of the substrate 10 by sputtering or the like. For example, a mask MK2 having an opening MK2a at a position outside the region FRG2 in addition to the position corresponding to the periphery of the plurality of electrode patterns 141-1 to 141-n in the region FRG2 is prepared, and the substrate 10 is sputtered from the +Z side over the mask MK2. Thus, the conductive film 30p is formed in a pattern extending planarly (that is, in X and Y directions) between the plurality of electrode patterns 141-1 to 141-n and outside the plurality of electrode patterns 141-1 to 141-n (see FIG. 2). That is, the conductive film 30p is formed in a pattern extending planarly (that is, in X and Y directions) between the plurality of bump electrodes 21 and outside the plurality of bump electrodes 21.

In the steps illustrated in FIGS. 7C, 7D, and 7E, processing similar to the steps illustrated in FIGS. 3C, 3D, and 1 are performed.

In such a manner, the conductive film 30p is disposed on the entire front surface 10a of the substrate 10. For example, the conductive film 30p covers the entire front surface 10a. The conductive film 30p overlaps the SRAM circuit in the Z direction. It is also possible with this structure to efficiently shield the SRAM circuit equipped in the semiconductor chip 20, and also other semiconductor chips 40, from radioactive rays (e.g., α rays) that may be generated from the substrate 10.

Figure 9:
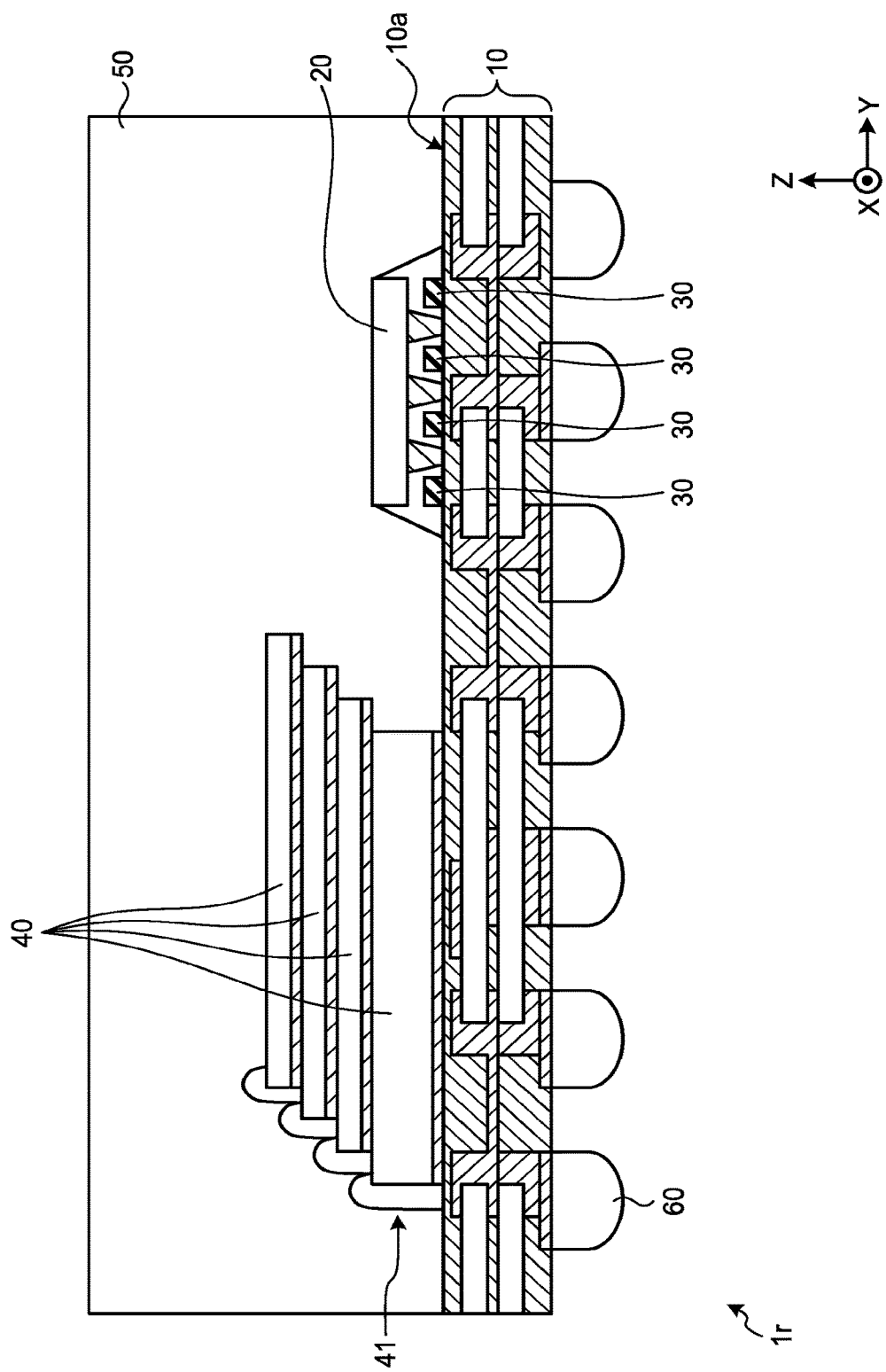
FIG. 9 is a sectional view illustrating the structure of a semiconductor device according to a fifth variation of an embodiment.

Alternatively, as illustrated in FIG. 9, the plurality of semiconductor chips 40 may be each a memory chip, for example, and may be mounted on the semiconductor chip 20 (controller chip) in a side-by-side structure. FIG. 9 is a sectional view illustrating the structure of a semiconductor device 1r according to a fifth variation of the embodiment. That is, the plurality of semiconductor chips 40 are stacked on the +Z side from the front surface 10a of the substrate 10 at a position separated in the X and Y directions with respect to the semiconductor chip 20. The plurality of semiconductor chips 40 may be mounted on the substrate 10 by a wire bonding method. Here, the conductive layer 14 that can be electrically connected with the plurality of bonding wires 41 in the substrate 10 has a plurality of electrode patterns 142-1 to 142-2k (k is an arbitrary integer of 2 or more) on the front surface (i.e., main face on the +Z side) 10a (see FIG. 2). Thus, the plurality of semiconductor chips 40 can be mounted on the substrate 10 in a side-by-side structure by a wire bonding method.

In this case, the conductive film 30 is provided on the front surface 10a of the substrate 10 in the semiconductor device 1r. For example, the conductive film 30 covers the front surface 10a of the substrate 10. The conductive film 30 overlaps the SRAM circuit in the Z direction. The conductive film 30 extends planarly between the plurality of bump electrodes 21. These points are similar to the embodiment or the first to fourth variations. It is also possible with such a structure to efficiently shield the SRAM circuit equipped in the semiconductor chip 20 from radioactive rays (e.g., α rays) that may be generated from the substrate 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
   a substrate having a main face;

a semiconductor chip that has a surface including a static random access memory (SRAM) circuit and that is mounted on the main face via a plurality of bump electrodes in a state where the surface faces the main face;

a conductive film that is disposed on the main face or the surface and that extends planarly between the plurality of bump electrodes; and a second semiconductor chip that is mounted on a plurality of electrode patterns disposed on the main face via a plurality of bonding wires, wherein a region in the main face or the surface where the conductive film is disposed overlaps the SRAM circuit in a direction perpendicular to the main face, and the conductive film encloses the bump electrodes with being apart from the bump electrodes and encloses the electrode patterns with being apart from the electrode patterns, in plan view.

2. The semiconductor device according to claim 1, wherein the region has an area substantially equal to an area of the SRAM circuit.

3. The semiconductor device according to claim 1, wherein the region has an area substantially equal to an area of the semiconductor chip.

4. The semiconductor device according to claim 1, wherein the region is an entire area of the main face.

5. The semiconductor device according to claim 1, wherein the conductive film covers the main face.

6. The semiconductor device according to claim 1, wherein the conductive film covers the surface.

7. The semiconductor device according to claim 1, wherein the conductive film is embedded in the main face.

8. The semiconductor device according to claim 1, wherein the conductive film is electrically insulated from the bump electrodes.

9. The semiconductor device according to claim 1, wherein the conductive film is in a potentially floating state.

10. The semiconductor device according to claim 1, wherein the conductive film is electrically connected with a ground potential.

11. The semiconductor device according to claim 1, wherein the substrate contains a radioactive substance.

12. The semiconductor device according to claim 1, wherein the substrate is an organic substrate.

13. A semiconductor device comprising:
a substrate having a main face;
a semiconductor chip that has a surface including a static random access memory (SRAM) circuit and that is mounted on the main face via a plurality of bump electrodes in a state where the surface faces the main face;

a conductive film that is disposed on the main face or the surface and that extends planarly between the plurality of bump electrodes; and a second semiconductor chip that is mounted on the semiconductor chip with a spacer structure on the main face, wherein a region in the main face or the surface where the conductive film is disposed overlaps the SRAM circuit in a direction perpendicular to the main face, the second semiconductor chip is mounted on a plurality of electrode patterns disposed on the main face via a plurality of bonding wires, and the conductive film encloses the bump electrodes with being apart from the bump electrodes and electrode patterns with being apart from the electrode patterns, in plan view.

14. The semiconductor device according to claim 13, wherein the region has an area substantially equal to an area of the SRAM circuit.

15. The semiconductor device according to claim 13, wherein the conductive film is embedded in the main face.

16. The semiconductor device according to claim 13, wherein the substrate contains a radioactive substance.

17. A semiconductor device comprising:
a substrate having a main face;
a semiconductor chip that has a surface including a static random access memory (SRAM) circuit and that is mounted on the main face via a plurality of bump electrodes in a state where the surface faces the main face;

a conductive film that is disposed on the main face or the surface and that extends planarly between the plurality of bump electrodes; and a second semiconductor chip that is mounted on the semiconductor chip with a side-by-side structure on the main face, wherein a region in the main face or the surface where the conductive film is disposed overlaps the SRAM circuit in a direction perpendicular to the main face, the second semiconductor chip is mounted on a plurality of electrode patterns disposed on the main face via a plurality of bonding wires, and the conductive film encloses the bump electrodes with being apart from the bump electrodes and electrode patterns with being apart from the electrode patterns, in plan view.

18. The semiconductor device according to claim 17, wherein the region has an area substantially equal to an area of the SRAM circuit.

19. The semiconductor device according to claim 17, wherein the conductive film is embedded in the main face.

20. The semiconductor device according to claim 17, wherein the substrate contains a radioactive substance.

* * * * *